(12) United States Patent
Yen (10) Patent No.: US 8,595,576 B2
(45) Date of Patent: Nov. 26, 2013

(54) SYSTEMS AND METHODS FOR EVALUATING AND DEBUGGING LDPC ITERATIVE DECODERS

(75) Inventor: Johnson Yen, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 215 days.

(21) Appl. No.: 13/174,453

(22) Filed: Jun. 30, 2011

(65) Prior Publication Data
US 2013/0007557 A1 Jan. 3, 2013

(51) Int. Cl.
*G01R 31/28* (2006.01)

(52) U.S. Cl.
USPC ........... 714/736; 714/733; 714/734; 714/735; 714/742; 714/792; 714/755; 714/795; 714/799

(58) Field of Classification Search
None
See application file for complete search history.

(56) References Cited

U.S. PATENT DOCUMENTS

| | | | |
|---|---|---|---|
| 4,763,328 A * | 8/1988 | Shimoda et al. ............ 714/703 |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,701,314 A | 12/1997 | Armstrong | |
| 5,710,784 A | 1/1998 | Kindred | |
| 5,712,861 A | 1/1998 | Inoue | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — John Trimmings
(74) *Attorney, Agent, or Firm* — Hamilton DeSanctis & Cha (57) ABSTRACT

Various embodiments of the present invention provide systems and methods for evaluating and debugging a data decoder. For example, a data decoder circuit is discussed that includes an input memory, a data decoder operable to decode data from the input memory in one or more iterations, an output memory operable to store decoded data from the data decoder, and a test port operable to provide access to the input memory, the data decoder and the output memory.

20 Claims, 5 Drawing Sheets

(56) References Cited

U.S. PATENT DOCUMENTS

| | | |
|---|---|---|
| 6,351,832 B1 | 2/2002 | Wei |
| 6,377,610 B1 | 4/2002 | Hagenauer |
| 6,381,726 B1 | 4/2002 | Weng |
| 6,438,717 B1 | 8/2002 | Butler |
| 6,473,878 B1 | 10/2002 | Wei |
| 6,504,881 B1 * | 1/2003 | Kim .............................. 375/341 |
| 6,535,553 B1 | 3/2003 | Limberg et al. |
| 6,625,775 B1 | 9/2003 | Kim |
| 6,657,803 B1 | 12/2003 | Ling |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,730,384 B2 | 6/2010 | Graef |
| 7,738,201 B2 | 6/2010 | Jin |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,245,104 B2 | 8/2012 | Yang et al. |
| 8,261,171 B2 | 9/2012 | Annampedu |
| 8,291,284 B2 | 10/2012 | Savin |
| 8,295,001 B2 | 10/2012 | Liu |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Olmos et al., "Tree-Structure Expectation Propagation for LDPC Decoding in Erasure Channels", Cornell University Library arXiv:1009.4287 (Sep. 22, 2010).

Shokrollahi "LDPC Codes: An Introduction", Digital Fountain, Inc. (Apr. 2, 2003).

Spagnol et al, "Hardware Implementation of GF(2^m) LDPC Decoders", IEEE Transactions on Circuits and Systemss̆: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/113,219 Unpublished filed May 23, 2011 Yang Han.

U.S. Appl. No. 13/171,615, Unpublished filed Jun. 29, 2011 Bradley D. Seago.

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

(56) References Cited

OTHER PUBLICATIONS

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR EVALUATING AND DEBUGGING LDPC ITERATIVE DECODERS

BACKGROUND

Various embodiments of the present invention are related to systems and methods for evaluating and debugging data decoders, and more particularly to systems and methods for evaluating and debugging low density parity check (LDPC) decoders.

Digital information storage and transmission has become ubiquitous in practically every facet of life throughout most of the world. Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

Figure 1:
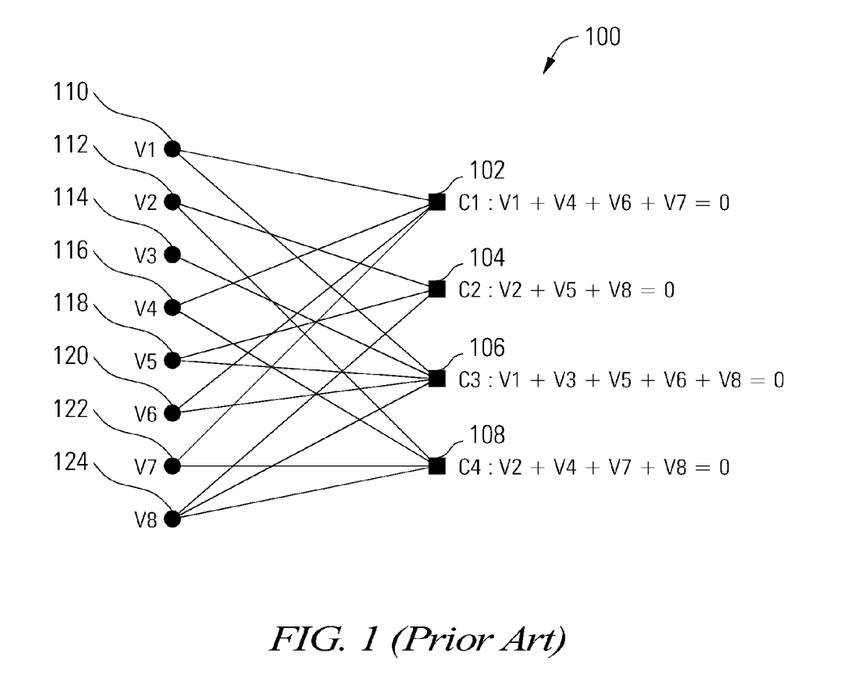
FIG. 1 depicts a Tanner graph of an example prior art LDPC code.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. Variable nodes 110-124 contain values based on a group of data and parity bits that are retrieved from a storage device, received by a transmission system or obtained in some other way. The number and placement of parity bits in the group are selected as the LDPC code is designed. The connections (or edges) between variable nodes 110-124 and check nodes 102-108 are also selected as the LDPC code is designed, balancing the strength of the code against the complexity of the decoder required to execute the LDPC code as data is obtained. The connections between variable nodes 110-124 and check nodes 102-108 may be presented in matrix form as follows, where columns represent variable nodes, rows represent check nodes, and a 1 at the intersection of a variable node column and a check node row indicates a connection between that variable node and check node:

$$H = \begin{bmatrix} 1 & 0 & 0 & 1 & 0 & 1 & 1 & 0 \\ 0 & 1 & 0 & 0 & 1 & 0 & 0 & 1 \\ 1 & 0 & 1 & 0 & 1 & 1 & 0 & 1 \\ 0 & 1 & 0 & 1 & 0 & 0 & 1 & 1 \end{bmatrix}$$

By providing multiple check nodes 102-108 for the group of variable nodes 110-124, redundancy in error checking is provided, enabling errors to be corrected as well as detected. Each check node 102-108 performs a parity check on bits passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed, generally by an XOR function, based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

Figure 2:
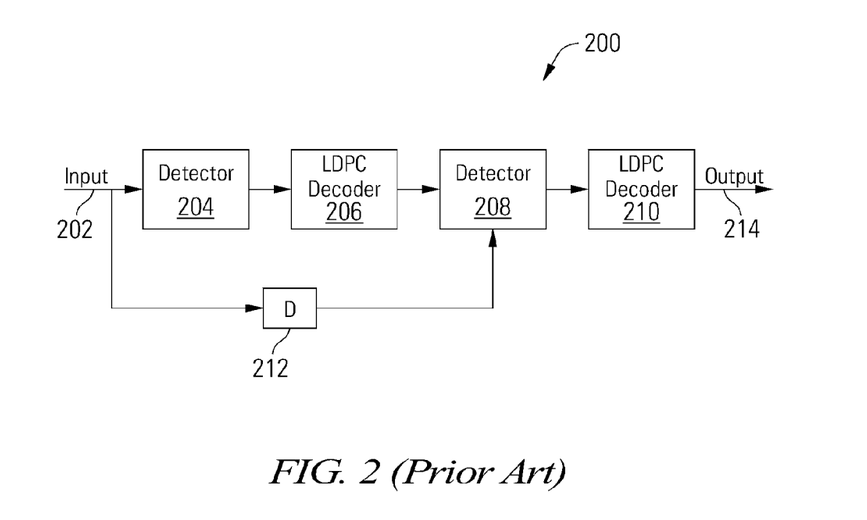
FIG. 2 depicts a prior art two stage data detection and decoding system.

Because of the iterative nature of the belief propagation algorithm used in LDPC decoders and the changing values in the check nodes 102-108 and variable nodes 110-124, it can be difficult to determine how the LDPC decoder is functioning, how errors might arise, and how the design of the LDPC decoder might be improved or optimized. Further complicating the issue of evaluating and debugging an LDPC decoder, a data detection and decode circuit including an LDPC decoder may utilize two or more global detection and decode iterations to increase the possibility of convergence. Turning to FIG. 2, an exemplary prior art two stage data detection and decode circuit 200 is depicted. Two stage data detection and decode circuit 200 receives a data input 202 that is applied to a detector 206. A hard and soft output from detector 204 is provided to an LDPC decoder 206. Input 202 is fed forward via a buffer 212 to another detector 208. Detector 208 uses a soft output of LDPC decoder 206 and input 202 to perform an additional data detection process. A hard and soft output from detector 208 is provided to an LDPC decoder 210 that performs a second decoding process and provides an output 214. Where the initial detection and decode provided by detector 204 and LDPC decoder 206 does not converge, the subsequent detection and decode provided by detector 208 and LDPC decoder 210 provide an additional opportunity to converge. Such an approach, however, requires two iterations for each input data set introduced as input 202. This may waste significant power and introduce unnecessary latency where the input is capable of converging in a single iteration. Further, in some cases two iterations is insufficient to result in a convergence. Thus, such an approach is both wasteful in some conditions and insufficient in other conditions.

Hence, for at least the aforementioned reasons, there exists a need in the art for advanced systems and methods for evaluating and debugging data decoders such as LDPC decoders.

BRIEF SUMMARY

Various embodiments of the present invention are related to systems and methods for evaluating and debugging data decoders, and more particularly to systems and methods for evaluating and debugging low density parity check (LDPC) decoders.

Various embodiments of the present invention provide systems and methods for evaluating and debugging a data decoder. For example, a data decoder circuit is discussed that includes an input memory, a data decoder such as an iterative LDPC decoder operable to decode data from the input memory in one or more iterations, an output memory operable to store decoded data from the data decoder, and a test port operable to provide access to the input memory, the data decoder and the output memory. In some cases, the input memory is operable to receive input data from a data input and from the test port, and the output memory is operable to provide output data to a data output and to the test port. In various embodiments, the data decoder circuit is implemented as an integrated circuit, incorporated in a storage device or a data transmission device. The test port may be connected to the input memory, the data decoder and the output memory by a register bus and may be used to control the data decoder, including the performance of decoding iterations. In some cases, the data decoder circuit also includes a controller operable to trigger a data decoding operation in the data decoder in response to the test port.

Other embodiments of the present invention provide methods of evaluating operation of a data decoder circuit, including providing codeword data to an input memory for a data decoder in the data decoder circuit, configuring the data decoder to process the codeword data from the input memory, determining when an iteration is complete in the data decoder, and reading resulting data from an output memory for the data decoder. In some cases, providing the codeword data includes preparing the codeword data and writing the codeword data to the input memory via a test port. The codeword data may be prepared based on a system behavior model for the data decoder. In some cases, configuring the data decoder includes configuring the data decoder to perform a number of decoding iterations on the codeword data. In some instances, data is read from the output memory for multiple decoding iterations, and the data from the multiple decoding iterations is compared. In some instances, the data from the output memory is compared with an expected result. In some instances, the data from the output memory is compared with the codeword data.

Other embodiments of the present invention provide systems for evaluating operation of a data decoder circuit, including an input memory, a data decoder operable to decode data from the input memory in one or more iterations, an output memory operable to store decoded data from the data decoder, a test port operable to provide access to the input memory, the data decoder and the output memory, and a processor operable to connect to the input memory, the data decoder and the output memory via a register bus, and to write test data to the input memory, to control decoding sessions in the data decoder, and to read decoded data from the output memory.

In some instances, the processor is operable to initiate multiple iterations in the data decoder and to read output data from the output memory for each of the multiple iterations for comparison.

In some instances, the systems also include a first detector operable to perform a data detection on an input data set at a first time, and a second detector operable to perform a data detection on the input data set using an output of the decoder from the output memory at a second and subsequent time only if the output of the decoder failed to converge.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various embodiments of the present invention are related to systems and methods for evaluating and debugging data decoders, and more particularly to systems and methods for evaluating and debugging low density parity check (LDPC) decoders.

Various embodiments of the present invention provide solutions for evaluating the performance of data decoders such as LDPC decoders which are iterative and process data multiple times before converging on a result. Such decoders are typically difficult to evaluate and debug, particularly when the decoder is used in a data processing channel, portions or all of which may be implemented in an integrated circuit. The systems and methods disclosed herein provide a powerful evaluation and debugging tool for error correcting performance of data decoders such as an iterative LDPC decoder. For example, in the design of a read channel for a storage medium such as a magnetic hard disk, the iterative LDPC decoding is often located at the last few stages of the read datapath. The inputs to the decoder typically cannot be directly accessed outside of the integrated circuit because they are in the middle of the datapath. The error correction performance analysis of the iterative LDPC decoder is complex and difficult on the silicon because of lack of accessibility of the input and output data. The systems and methods disclosed herein provide valuable direct access to the memories that store input data and output data for the LDPC decoder, as well as providing controls to initiate a decoding session using pre-loaded data and to retrieve intermediate and final data from the decoding process for analysis and debugging. The systems and methods disclosed herein can also be used to effectively isolate the decoder circuit from other circuits in the data path during testing.

Figure 3:
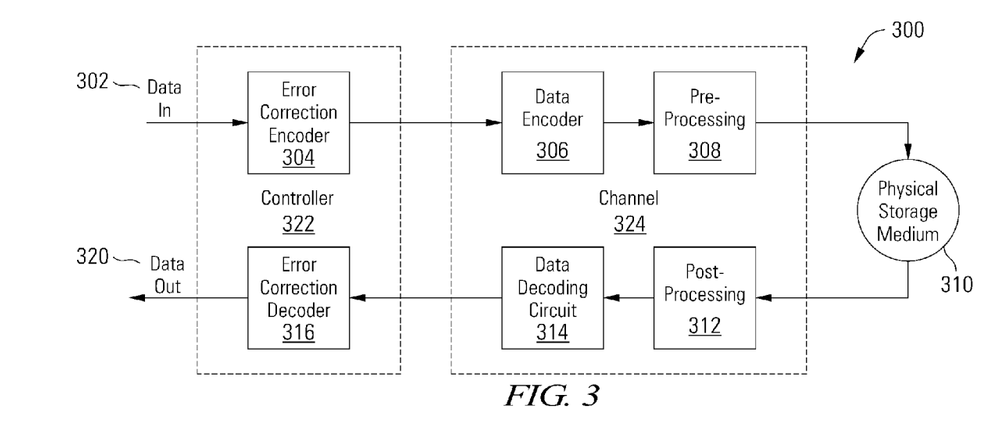
FIG. 3 depicts an example data storage system using a data decoder with evaluation/debugging interface in accordance with some embodiments of the present invention.

Turning to FIG. 3, a storage system 300 including a data decoding circuit having an evaluation/debugging interface 314 is shown in accordance with some embodiments of the present invention. Storage system 300 includes a controller 322, a channel 324, and a physical storage medium 310. Physical storage medium 310 may be, but is not limited to, a magnetic disk. Based on the disclosure provided herein, one of ordinary skill in the art will recognize a variety of physical storage media that may be used in relation to different embodiments of the present invention. Controller 322 includes error correction encoding and decoding. In particular, controller 322 includes an error correction encoder 304. Error correction encoder 304 may be any error correction encoder known in the art including, but not limited to, a Reed Solomon encoder or a CRC encoder, and error correction decoder 316 may be, but is not limited to, a corresponding Reed Solomon decoder or CRC decoder. Both the aforementioned encoder and decoder may be any circuit or system known in the art that is capable of performing encoding and decoding processes. Channel 324 includes a data encoder 306 and a pre-processing circuit 308. In some cases, data encoder 306 is an LDPC encoder. Based on the disclosure provided herein, one of ordinary skill in the art will recognize a variety of encoding processes and corresponding decoding processes that may be implemented in accordance with different embodiments of the present invention. Pre-processing circuit 308 includes the various pre-processing circuitry that is well known in the art. Post-processing circuit 312 includes the various post-processing circuitry that is well known in the art for receiving data from a physical storage medium and for preparing the received data for data detection and decoding.

In addition, channel 324 includes data decoding circuit 314 that is capable of performing a variable number of detection and decoding iterations depending upon processing availability and/or convergence. Such a data decoding circuit 314 allows for performing a variable number of iterations on a given input, while minimizing the number of iterations that must be performed. The evaluation and debugging interface in the data decoding circuit 314 enables data to be pre-loaded in the data decoding circuit 314, the decoding process to be controlled, and the resulting data to be read from the data decoding circuit 314. By comparing the input and output data, faults and potential improvements and optimizations can be identified in the data decoding circuit 314.

During operation of the storage system 300, a data input 302 is received. Data input 302 may be any data set destined for storage on physical storage medium 310. Data input 302 is encoded using error correction encoder 304 as is known in the art. The output of error correction encoder 304 is provided to data encoder 306 that may, for example, perform an LDPC encoding of the data. The output of data encoder 306 is provided to pre-processing circuit 308 that may convert the output from a digital output to an analog output satisfactory for writing to physical storage medium 310.

The data previously written to physical storage medium 310 may be subsequently retrieved and processed by post-processing circuit 312. In one case, post-processing circuit 312 performs an amplification of an analog data signal retrieved from physical storage medium 310, and converts the amplified analog signal to a digital signal that is output to data decoding circuit 314. In turn, data decoding circuit 314 performs a variable number of data detection and data decoding processes until either the output of the processes converges (i.e., it adequately represents the original data encoded by data encoder 306) or until insufficient resources remain to perform additional processing. Data decoding circuit 314 provides its result as an output to error correction decoder 316. Error correction decoder 316 performs the designated error correction processing to determine whether any errors remain and if detected, attempts to correct the errors. Once the error correction processes are completed, error correction decoder 316 provides a data output 320. In general, data output 320 corresponds to data input 302 that was originally provided for writing to physical storage medium 310.

The evaluation and/or debugging of data decoding circuit 314 can be performed by accessing memories at the input and output of an LDPC data decoder or other data decoder in the data decoding circuit 314 and running the data decoder in the data decoding circuit 314. The evaluation and/or debugging can be performed during operation of the storage system 300, evaluating the decoding of data as it is retrieved from physical storage medium 310. The evaluation and/or debugging can also be performed during operation of the storage system 300 but with replacement data loaded to the data decoding circuit 314 via the evaluation/debugging interface. The evaluation and/or debugging can also be performed on the data decoding circuit 314 when the storage system 300 is not active, by loading data into an input memory in the data decoding circuit 314, operating the data decoding circuit 314 through one or more iterations, then reading the data from an output memory in the data decoding circuit 314.

Figure 4:
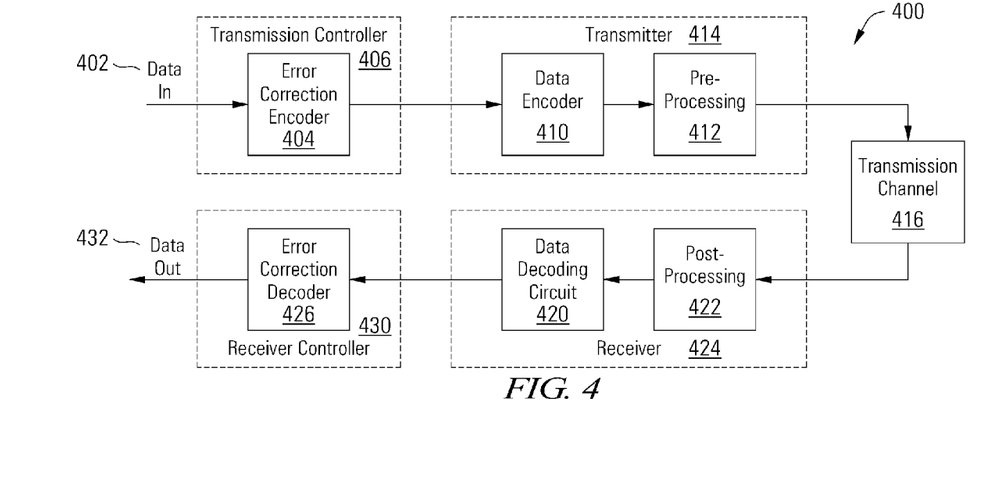
FIG. 4 depicts an example data transfer system using a data decoder with evaluation/debugging interface in accordance with some embodiments of the present invention.

Turning to FIG. 4, a transmission system 400 including a data decoding circuit having an evaluation/debugging interface 420 is depicted in accordance with some embodiments of the present invention. Transmission system 400 includes a transmission controller 406, a transmitter 414, a transmission channel 416, a receiver 424, and a receiver controller 430. Transmission channel may be, but is not limited to, an RF transmission channel. Based on the disclosure provided herein, one of ordinary skill in the art will recognize a variety of transmission channels that may be used in relation to different embodiments of the present invention. Transmission controller 406 includes an error correction encoder 404 that may be implemented, for example, as a Reed Solomon encoder or a CRC encoder. Similarly, receiver controller 430 includes an error correction decoder 426 corresponding to error correction encoder 404. Thus, error correction decoder 426 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 414 includes a data encoder 410 and a pre-processing circuit 412. In some cases, data encoder 410 is an LDPC encoder. Based on the disclosure provided herein, one of ordinary skill in the art will recognize a variety of encoding processes that may be implemented in accordance with different embodiments of the present invention. Pre-processing circuit 412 includes the various pre-processing circuitry that is well known in the art. In one particular case, pre-processing circuit 412 is operable to convert a digital data set from data encoder 410 to a corresponding RF signal suitable for transmission via transmission channel 416. The data set transferred via transmission channel 416 is received using a post-processing circuit 422 of receiver 424. Post-processing circuit 422 includes the various post-processing circuitry that is well known in the art for receiving data from a transmission channel and for preparing the received data for data detection and decoding.

In addition, receiver 424 includes data decoding circuit 420 that is capable of performing a variable number of detection and decoding iterations depending upon processing availability and/or convergence, and which supports evaluation and debugging of data decoding by transferring data in and out of a data decoder and by controlling processing of the data in the data decoder. Such a data decoding circuit 420 allows for performing a variable number of iterations on a given input.

In operation, a data input 402 is received. Data input 402 may be any data set destined for transmission via transmission channel 416. Data input 402 is encoded using error correction encoder 404 as is known in the art. The output of error correction encoder 404 is provided to data encoder 410 that may, for example, perform an LDPC encoding of the data. The output of data encoder 410 is provided to pre-processing circuit 412 that may convert the output from a digital output to an analog output satisfactory for transmission via transmission channel 416.

The data transmitted via transmission channel 416 is received and processed by post-processing circuit 422 of receiver 424. In one case, post-processing circuit 422 performs an amplification of an analog data signal retrieved from transmission channel 416, and converts the amplified analog signal to a digital signal that is output to data decoding circuit 420. In turn, data decoding circuit 420 performs a variable number of data detection and data decoding processes until either the output of the processes converges (i.e., it adequately represents the original data encoded by data encoder 410) or until insufficient resources remain to perform additional processing. Data decoding circuit 420 provides its result as an output to error correction decoder 426. Error correction decoder 426 performs the designated error correction processing to determine whether any errors remain and if detected, attempts to correct the errors. Once the error correction processes are completed, error correction decoder 426 provides a data output 432. In general, data output 432 corresponds to data input 402 that was originally provided for transmission via transmission channel 416.

As with the storage system 300 of FIG. 3, the operation of the data decoding circuit 420 can be evaluated and/or debugged by accessing memories at the input and output of an LDPC data decoder or other data decoder in the data decoding circuit 420 and running the data decoder in the data decoding circuit 420. The evaluation and/or debugging can be performed during operation of the transmission system 400, evaluating the decoding of data as it is received from transmission channel 416 and processed by post-processing circuit 422. The evaluation and/or debugging can also be performed during operation of the transmission system 400 but with replacement data loaded to the data decoding circuit 420 via the evaluation/debugging interface. The evaluation and/or debugging can also be performed on the data decoding circuit 420 when the transmission system 400 is not active, by loading data into an input memory in the data decoding circuit 420, operating the data decoding circuit 420 through one or more iterations, then reading the data from an output memory in the data decoding circuit 420.

It should be noted that while FIGS. 3 and 4 depict a storage system and a transmission system to which systems and methods for evaluating and debugging data decoders such as LDPC data decoders may be applied, there are a variety of systems in which data decoder evaluation and debugging systems and methods in accordance with different embodiments of the present invention may be applied. Based on the disclosure provided herein, one of ordinary skill in the art will recognize a variety of systems that may be benefited by use of systems and methods for evaluating and debugging data decoders in accordance with different embodiments of the present invention.

Figure 5A:
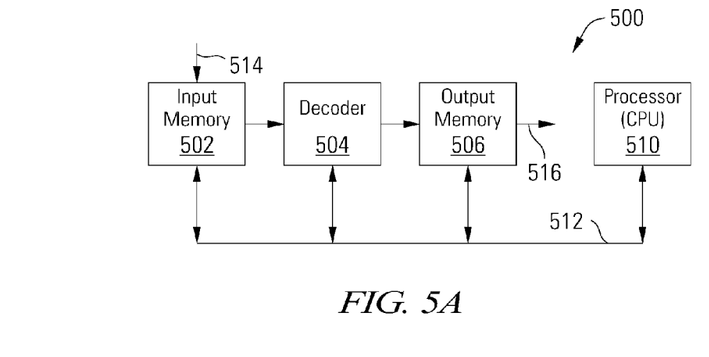
FIGS. 5A-B depict systems for evaluating and/or debugging a data decoder in accordance with some embodiments of the present invention.

Turning to FIG. 5A, a system 500 for evaluating and/or debugging a data decoder is depicted in accordance with some embodiments of the present invention. The system 500 includes a data decoder 504, which may comprise an iterative LDPC decoder or any other type of data decoder. The data decoder 504 may be used as the data decoders 314 and 420 of FIGS. 3 and 4, or as a component in the data decoders 314 and 420 of FIGS. 3 and 4 along with other circuitry. The data decoder 504 may be connected to one or more input memories 502 and to one or more output memories 506. The memories 502 and 506 may comprise any suitable temporary storage device capable of holding or buffering data to and from the data decoder 504, and may be connected to the data decoder 504 using any suitable bus or data transmission architecture. Notably, the memories 502 and 506 may be integral parts of a decoder through which data is cycled during local decoding iterations, thereby providing access to variable node and check node data during each local iteration of an iterative decoding operation, or may be external memories connected to a decoder, providing access to input and output data to the decoder during each global iteration as decoded data is fed back in a feedback loop.

A processor 510 is connected to the input memory 502, the data decoder 504 and the output memory 506 by a bus 512. Bus 512 may be, but is not limited to, a register bus, enabling the processor 510 to read and write memory content and to control the data decoder 504 by accessing values in registers. Based on the disclosure provided herein, one of ordinary skill in the art will recognize a variety of buses that may be used to connect the processor 510 to the input memory 502, data decoder 504 and output memory 506 in accordance with different embodiments of the present invention. For example, the input memory 502 and data decoder 504 may be accessed directly in some embodiments using a memory bus. The processor 510 may be, but is not limited to, a component in an external general purpose computer, adapted with a test port for connection to bus 512, or part of a dedicated test fixture for the data decoder 504.

During operation, data is provided to the input memory 502 to be decoded in the data decoder 504, either at an input 514 from a source such as the physical storage medium 310 or the transmission channel 416, or loaded via the bus 512 by processor 510. For example, test data may be prepared based on the system behavior model, either in the processor 510 or elsewhere, and loaded into the input memory 502. The processor 510 may then access control registers in the data decoder 504 if needed to initiate a decoding operation, or may simply monitor status registers in the data decoder 504 to determine when an iteration or a decoding operation is complete. The data decoder 504 performs one or more decoding iterations on the data from the input memory 502 and stores the results in the output memory 506. The data decoder 504 may be adapted to store only the decoded data in the output memory 506, or may be adapted to store additional data in the output memory 506 for retrieval by the processor 510, such as variable node and check node values and messages between variable nodes and check nodes, if further information is desired for analyzing and optimizing performance of the data decoder 504. The processor 510 may then read the partially or completely decoded data from the output memory 506 for analysis. Thus, the system 500 enables data to be accessed from the input memory 502 before decoding and from the output memory 506 after decoding during normal operation as data is provided at input 514, or to isolate the data decoder 504 from outside circuits by preparing and loading test data in the input memory 502, operating the data decoder 504 and reading the resulting decoded data from the output memory 506, with or without decoded data being provided at the output 516 of the output memory 506.

In the embodiments using a register bus 512, registers may be provided in the input memory 502, data decoder 504 and output memory 506 to read and write data, to control operation of the data decoder 504 and to retrieve the status of decoding operations in the data decoder 504. These registers may include, but are not limited to, registers that reset the data decoder 504, registers that program a particular number of decoding iterations to perform, registers that initiate a decoding session or an iteration in a decoding session, a status register indicating when a decoding session or an iteration in a decoding session is complete, and registers for reading and writing data to memories 502 and 506, such as read/write registers, address and data registers.

Figure 5B:
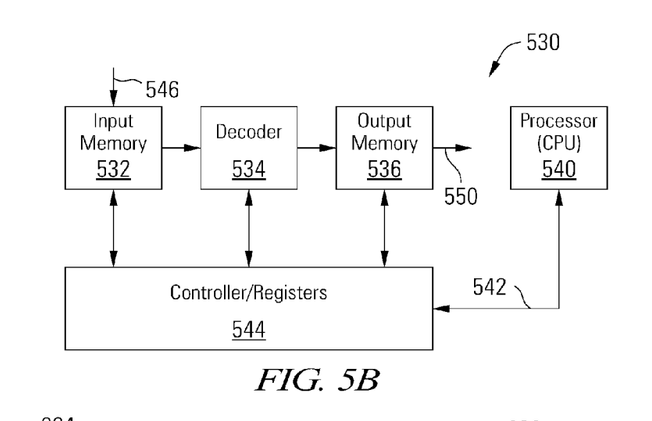

Turning to FIG. 5B, in some embodiments of a system 530 for evaluating and/or debugging a data decoder 534, a controller 542 provides access to one or more input memories 532, a data decoder 534, and one or more output memories 536, enabling a processor 540 to evaluate or debug the performance of the data decoder 534. The data decoder 534 may be, but is not limited to, an iterative LDPC decoder, or may be a data decoder circuit including an LDPC decoder along with other data processing circuitry. The memories 532 and 536 may be any suitable temporary storage device capable of holding or buffering data to and from the data decoder 534, and may be connected to the data decoder 534 using any suitable bus or data transmission architecture. The memories 532 and 536 may be integral parts of a decoder through which data is cycled during local decoding iterations, thereby providing access to variable node and check node data during each local iteration of an iterative decoding operation, or may be external memories connected to a decoder, providing access to input and output data to the decoder during each global iteration as decoded data is fed back in a feedback loop.

The processor 540 is connected to the controller 544 by a bus 542. The controller 544 is connected to the input memory 532, the data decoder 534 and the output memory 536. In other embodiments, the controller may be connected between the processor and the data decoder, with the input and output memories directly connected to the processor. Bus 542 may be, but is not limited to, a register bus, enabling the processor 540 to read and write memory content and to control the data decoder 534 by accessing values in registers in the controller 544. Based on the disclosure provided herein, one of ordinary skill in the art will recognize a variety of buses that may be used to connect the processor 540 to the controller 544 in accordance with different embodiments of the present invention. The processor 540 may be, but is not limited to, a component in an external general purpose computer, adapted with a test port for connection to controller 544 via bus 542, or part of a dedicated test fixture for the data decoder 534.

During operation, data is provided to the input memory 532 to be decoded in the data decoder 534, either at an input 546 from a source such as the physical storage medium 310 or the transmission channel 416, or loaded via the controller 544 by processor 540. For example, test data may be prepared based on the system behavior model, either in the processor 540 or elsewhere, and loaded into the input memory 532 through controller 544. The processor 540 may then access control registers in the controller 544 if needed to initiate a decoding operation in the data decoder 534, or may simply monitor status registers in the controller 544 to determine when an iteration or a decoding operation is complete. The data decoder 534 performs one or more decoding iterations on the data from the input memory 532 and stores the results in the output memory 536. The data decoder 534 may be adapted to store only the decoded data in the output memory 536, or may be adapted to store additional data in the output memory 536 for retrieval by the processor 540 through controller 544, such as variable node and check node values and messages between variable nodes and check nodes, if further information is desired for analyzing and optimizing performance of the data decoder 534. The processor 540 may then read the partially or completely decoded data from the output memory 536 for analysis. Thus, the system 530 enables data to be accessed from the input memory 532 before decoding and from the output memory 536 after decoding during normal operation as data is provided at input 546, or to isolate the data decoder 534 from outside circuits by preparing and loading test data in the input memory 532, operating the data decoder 534 and reading the resulting decoded data from the output memory 536, with or without decoded data being provided at the output 550 of the output memory 536.

Registers are provided in the controller 544 to read and write data to the input memory 532 and the output memory 536, to control operation of the data decoder 534 and to retrieve the status of decoding operations in the data decoder 534. These registers may include, but are not limited to, registers that reset the data decoder 534, registers that program a particular number of decoding iterations to perform, registers that initiate a decoding session or an iteration in a decoding session, a status register indicating when a decoding session or an iteration in a decoding session is complete, and registers for reading and writing data to memories 532 and 536, such as read/write registers, address and data registers. Firmware may be provided in the controller 544 for controlling tests and for interacting with the input memory 532, data decoder 534 and output memory 536 based on the values of the registers in the controller 544 and for setting the values of registers in the controller 544 to be read by the processor 540.

Figure 6:
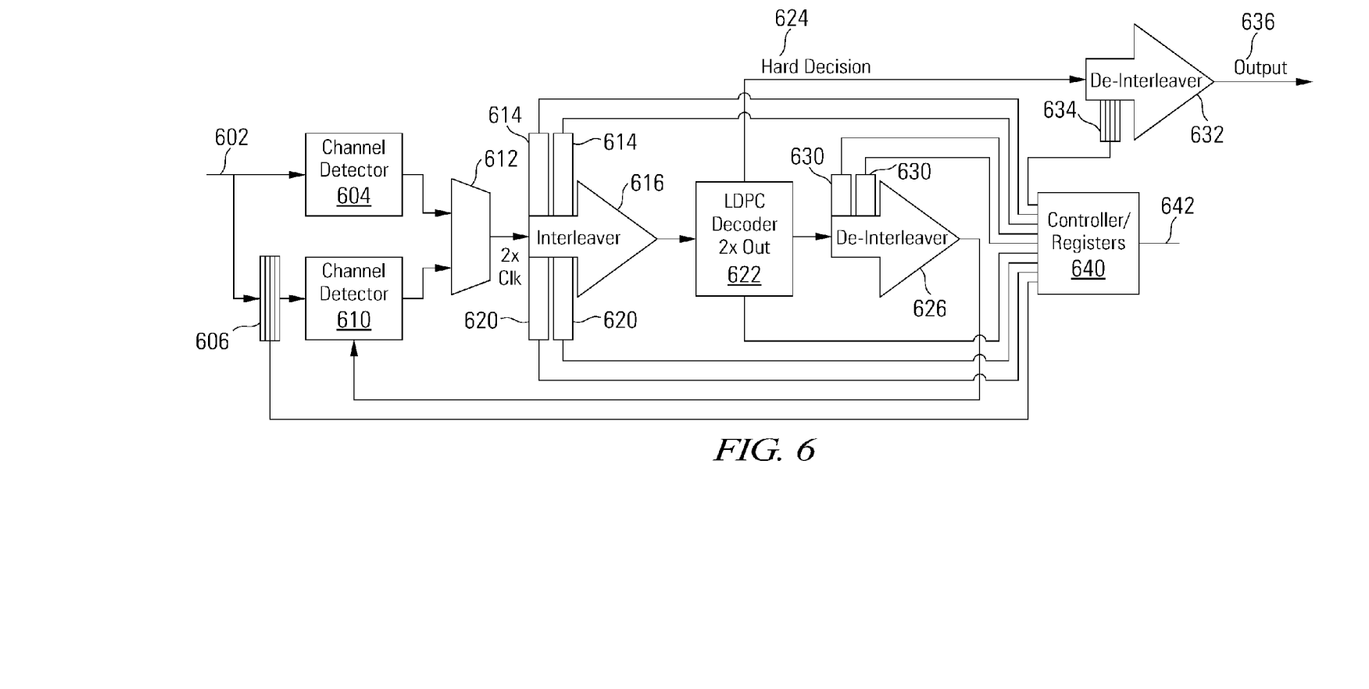
FIG. 6 depicts a data detection and decoding circuit with evaluation/debugging interface in accordance with various embodiments of the present invention.

Turning to FIG. 6, one implementation of a data decoding circuit 600 that may include an LDPC decoder with evaluation/debugging interface and that may be used in place of the data decoding circuit 314 and data decoding circuit 420 of FIGS. 3 and 4 is depicted in accordance with some embodiments of the present invention. Data decoding circuit 600 includes a data input 602 that is fed to a channel detector 604. Channel detector 604 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 602 is provided to an input data buffer 606 that is designed to hold a number of data sets received from data input 602. The size of input data buffer 606 may be selected to provide sufficient buffering such that a data set input via data input 602 remains available at least until a first iteration processing of that same data set is complete and the processed data is available in a ping pong buffer 630 (i.e., a queuing buffer) as more fully described below. Input data buffer 606 provides the data sets to a channel detector 610. Similar to channel detector 604, channel detector 610 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 604 and channel detector 610 are provided to an interleaver circuit 616 via a multiplexer 612. Such outputs may be, for example, log likelihood ratio values. Interleaver circuit 616 interleaves the output of channel detector 604 and separately interleaves the output of channel detector 610 using two ping pong buffers 614, 620. One of the buffers in ping pong buffer 614 holds the result of a prior interleaving process of the output from channel detector 604 and is unloaded to an LDPC decoder 622, while the other buffer of ping pong buffer 614 holds a data set from channel detector 604 that is currently being interleaved. Similarly, one of the buffers in ping pong buffer 620 holds the result of a prior interleaving process of the output from channel detector 610 and is unloaded to LDPC decoder 622, while the other buffer of ping pong buffer 620 holds a data set from channel detector 610 that is currently being interleaved.

LDPC decoder 622 is capable of decoding one or more data sets simultaneously. As an example, LDPC decoder 622 may be designed to decode an interleaved data set from ping pong buffer 614, or an interleaved data set from ping pong buffer 620, or to decode interleaved data sets from ping pong buffer 614 and ping pong buffer 620 simultaneously. The decoded data is either provided as a hard decision output 624 and/or to a de-interleaver circuit 626 that uses ping pong buffer 630 to de-interleave the decoded data and to provide the de-interleaved data as an input to channel detector 610. One of the buffers in ping pong buffer 630 holds the result of a prior de-interleaving process and is unloaded to channel detector 610, while the other buffer of ping pong buffer 630 holds a decoded data set currently being de-interleaved. Hard decision output 624 is provided to a de-interleaver circuit 632 that de-interleaves hard decision output 624 and stores the de-interleaved result in an output data buffer 634. Ultimately, de-interleaver circuit 632 provides the de-interleaved data stored in output data buffer 634 as an output 636.

In normal operation, a first data set is introduced via data input 602 to channel detector 604. Channel detector 604 performs its channel detection algorithm and provides both a hard output and a soft output to multiplexer 612. The hard and soft decision data is written to one buffer of ping pong buffer 614. At the same time the detector output is written into the buffer, interleaver 616 interleaves the data set by writing consecutive data into non-consecutive memory/buffer addresses based on the interleaver algorithm/mapping. Once interleaver 616 completes its interleaving process, the interleaved data is decoded by LDPC decoder 622. Where the data converges, LDPC decoder 622 writes its output as hard decision output 624 to output data buffer 634 and the processing is completed for that particular data set. Alternatively, where the data does not converge, LDPC decoder 622 writes its output (both soft and hard) to ping pong buffer 630.

The data written to ping pong buffer 630 is fed back to channel detector 610. Channel detector 610 selects the data set that corresponds to the output in ping pong buffer 630 from input data buffer 606 and performs a subsequent data detection aided by the soft output data generated by LDPC decoder 622 fed back from ping pong buffer 630. By using the previously generated soft data for data maintained in input data buffer 606, channel detector 610 generally performs a subsequent channel detection with heightened accuracy. The output of this subsequent channel detection is passed to interleaver 616 via multiplexer 612. The data is written to one buffer of ping pong buffer 620, and interleaver 616 interleaves the data. The interleaved data is then passed to LDPC decoder 622 where it is decoded a second time. Similar to the first iteration, a decision is made as to whether the data converged or whether there is insufficient space in ping pong buffer 630 to handle the data. Where such is the case, LDPC decoder 622 writes its output as hard decision output 624 to output data buffer 634 and the processing is complete for that particular data set. Alternatively, where the data does not converge and there is sufficient buffer space in ping pong buffer 630 to receive an additional data set, LDPC decoder 622 writes its output (both soft and hard) to ping pong buffer 630 where it is passed back to channel detector 610 for a third pass. Sufficient space is defined in ping pong buffer 630 by having at least reserved space for the data set from the first detector and decoder iteration after the data set from the second detector and decoder iteration is written into the ping pong buffer 630.

It should be noted that, as an example, a first data set may be applied at data input 602 and that it takes a number of iterations to converge while all subsequent data sets applied at data input 602 converge on the first pass (i.e., on a single iteration). In such a case, the first data set may be processed a number of times (i.e., a number of global iterations) that is limited by the amount of memory available in output data buffer 634. The term "global iteration" is used herein to refer to data passing from a detector (e.g., 604, 610) to the LDPC Decoder 622. The term "local iteration" is used herein to refer to a stage of processing internally in the LDPC Decoder 622, for example when data is passed from variable nodes 110-124 (FIG. 1), to check nodes 102-108 and back to variable nodes 110-124. Once output data buffer 634 is full or once an ordered set of outputs are available, the most recent hard decision output corresponding to the first data set is provided as a hard decision output and de-interleaver 634 re-orders the outputs putting the first output in the first position. With this done, output data buffer 634 is flushed out as output 636. In some embodiments of the present invention, de-interleaver 632 does not perform a re-ordering function and output data buffer 634 has a very limited size. In such a case, it is conceivable that a data set could be processed a very large number times (i.e., a large number of iterations) only limited by how long a recipient of output 636 is willing to wait for the data. As another example, it is possible that all data applied as data input 602 converges on its first pass. In such a case, channel detector 610, LDPC decoder 622 and/or de-interleaver 626 may be placed in a power saving mode to conserve power. As yet another example, it may be the case that all data sets applied at data input 602 fail to converge on the first pass (i.e., a single iteration). In such a case, all data sets would be iterated twice. It should also be noted that one or more additional channel detectors may be added along with additional space in ping pong buffers 614, 620, 630 that would facilitate more iterations in the situation where a significant number of closely located data sets fail to converge. In such cases, all data sets can be guaranteed to be decoded with the same number of iterations as the number of detectors.

A controller 640 is connected to the LDPC decoder 622 and to one or more of the memories or buffers, providing for evaluation and debugging of LDPC decoder 622. The controller 640 contains control and status registers enabling a processor (e.g., 510, 540) to control operation of the LDPC decoder 622 or of the entire data decoding circuit 600. Various connections are shown as examples in FIG. 6 between the controller 640 and elements of the data decoding circuit 600, including the LDPC decoder 622, memories at the input to the LDPC decoder 622 including the ping pong buffers 614, 620, and memories at the output of the LDPC decoder 622 such as ping pong buffer 630. Other elements such as the input data buffer 606 and hard decision output 624 may also be connected to the controller 640, enabling data to be stored in or retrieved from these memories during the course of evaluating and debugging the LDPC decoder 622. In other embodiments, as discussed above, control and status registers may be integrated directly into the LDPC decoder 622 and other components of the data decoding circuit 600 and accessed directly by bus 642, to which an external processor (e.g., 510, 540) or other test fixture may be connected. The connections between the bus 642 and the LDPC decoder 622 and memories (e.g., 614, 620, 630) and registers or other control structures (such as controller 640) used to read and write data to the memories (e.g., 614, 620, 630) and to control operation of the LDPC decoder 622 provide an evaluation/debugging interface to the data decoding circuit 600. The evaluation/debugging interface, which includes the bus 642, registers or other control structures and connections to the LDPC decoder 622 and memories (e.g., 614, 620, 630) is also referred to herein as a test port.

Based on the disclosure provided herein, it will be appreciated that the evaluation/debugging interface provides a powerful tool for designing and optimizing the LDPC decoder 622 and other elements of the data decoding circuit 600. The evaluation/debugging interface provides access to data that would otherwise be unavailable, being in the middle of an iterative datapath in an integrated circuit. The evaluation/debugging interface further provides a direct control to initiate a decoding session with pre-loaded data prepared based on the system model, after which the intermediate and final data from the decoding session can be retrieved for analysis and debugging.

Figure 7:
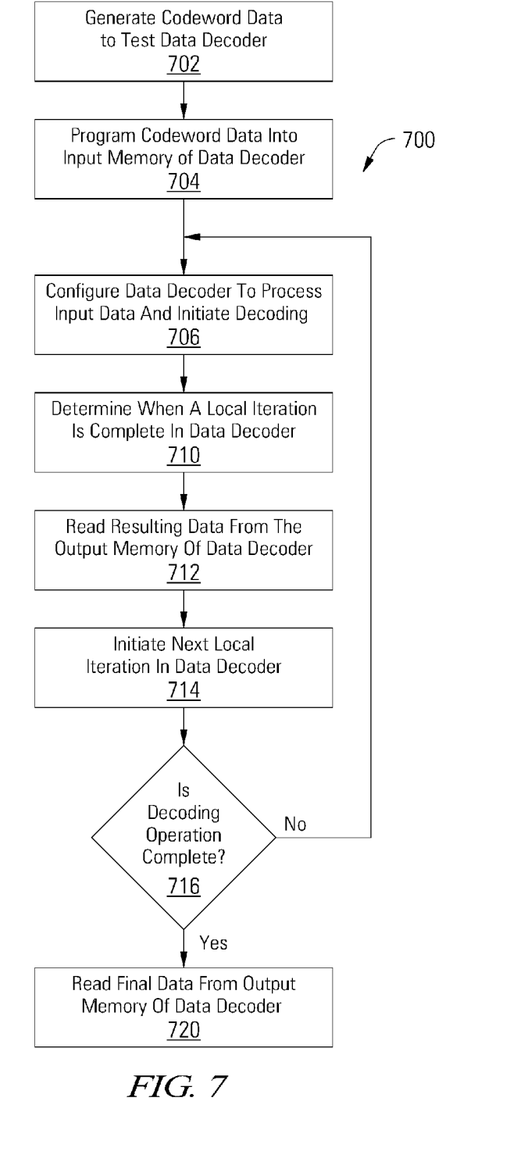
FIG. 7 is a flow diagram showing a method in accordance with some embodiments of the present invention for evaluating intermediate data from a local iteration of a data decoding operation.

Turning to FIG. 7, a flow diagram 700 depicts a method in accordance with some embodiments of the present invention for evaluating intermediate data from a local iteration of a data decoding operation. The method of FIG. 7, or variations thereof, may be performed in data decoding circuits such as those illustrated in FIGS. 3-6. Following flow diagram 700, codeword data is generated to test a data decoder (block 702), and the codeword data is programmed into the input memory of the data decoder. (Block 704) The codeword data may be generated based on the system behavior model to exercise the data decoder, and may be generated in an external processor or test fixture or in any other suitable manner. In other embodiments, the data decoder may be tested using data obtained through the normal data channel, for example from a physical storage medium 310 or transmission channel 416.

The data decoder is configured to process the input data and the decoding operation is initiated. (Block 706) This may include resetting the data decoder before beginning the decoding operation, programming the number of iterations performed, or configuring other aspects of the data decoder behavior. A controller (e.g., 544, 640) or external processor (e.g., 510, 540) determines when a local iteration is complete in the data decoder. (Block 710) This may be performed, for example, by polling a status register set by the data decoder, or by configuring the data decoder to generate an event indicating when the local iteration is complete, or by setting a timer to expire after a predetermined duration sufficient to allow a local iteration to fully complete. The resulting data is read from the output memory of the data decoder (block 712), and the next local iteration is initiated in the data decoder. (Block 714) The next local iteration may be triggered explicitly by the controller (e.g., 544, 640) or external processor (e.g., 510, 540), or the data decoder may be configured at the beginning of the decoding operation to perform multiple local iterations, with the controller (e.g., 544, 640) or external processor (e.g., 510, 540) automatically reading data from the output memory after each local iteration before it is overwritten or changed by the next local iteration. If the decoding operation is complete as determined in block 716, the final data is read from the output memory (block 720), otherwise, the next local iteration is performed and the method continues with block 706.

By reading data after every local iteration, the results of each local iteration can be compared to evaluate the performance of the data decoder. For example, a codeword can be prepared with errors such that the data decoder should converge after one iteration. Then, if the data decoder fails to converge after one iteration, the data before and after the iteration can be compared by performing a difference operation on the data to determine how the data was changed during the iteration. Furthermore, a difference operation can be performed between the actual output data and the expected output data to help determine how the data detector failed. A codeword can also be prepared with errors such that the data decoder should converge after two iterations, enabling a difference operation to be performed between the output data after the first iteration and the output data after the second iteration to check the progress between multiple iterations.

Figure 8:
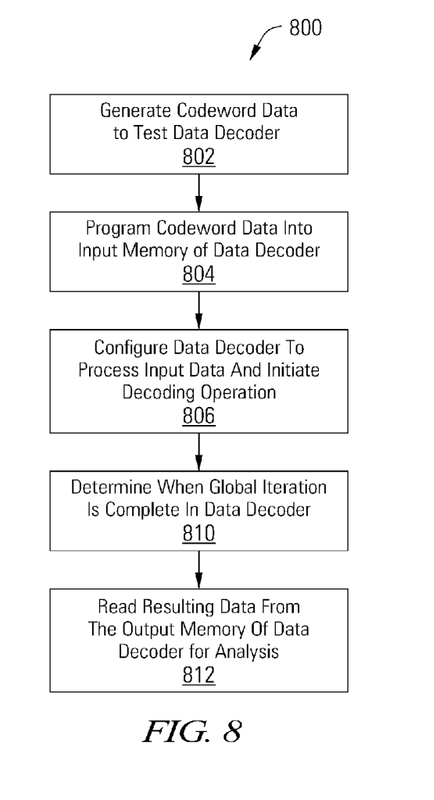
FIG. 8 is a flow diagram showing a method in accordance with some embodiments of the present invention for evaluating final data from a global iteration of a data decoding operation.

Turning to FIG. 8, a flow diagram 800 depicts a method in accordance with some embodiments of the present invention for evaluating final data from a global iteration of a data decoding operation. The method of FIG. 8, or variations thereof, may be performed in data decoding circuits such as those illustrated in FIGS. 3-6. Following flow diagram 800, codeword data is generated to test a data decoder (block 802), and the codeword data is programmed into the input memory of the data decoder. (Block 804) The codeword data may be generated based on the system behavior model to exercise the data decoder, and may be generated in an external processor or test fixture or in any other suitable manner. In other embodiments, the data decoder may be tested using data obtained through the normal data channel, for example from a physical storage medium 310 or transmission channel 416.

The data decoder is configured to process the input data and the decoding operation is initiated. (Block 806) This may include using a controller (e.g., 544, 640) or external processor (e.g., 510, 540) to program registers to reset the data decoder before beginning the decoding operation, to program the number of iterations to perform, or to configure other aspects of the data decoder behavior. A controller (e.g., 544, 640) or external processor (e.g., 510, 540) determines when the global iteration is complete in the data decoder, which may include one or more local iterations. (Block 810) This may be performed, for example, by polling a status register set by the data decoder, or by configuring the data decoder to generate an event indicating when the global iteration is complete, or by setting a timer to expire after a predetermined duration sufficient to allow a global iteration to fully complete. The resulting data is read from the output memory of the data decoder for analysis. (Block 812)

Figure 9:
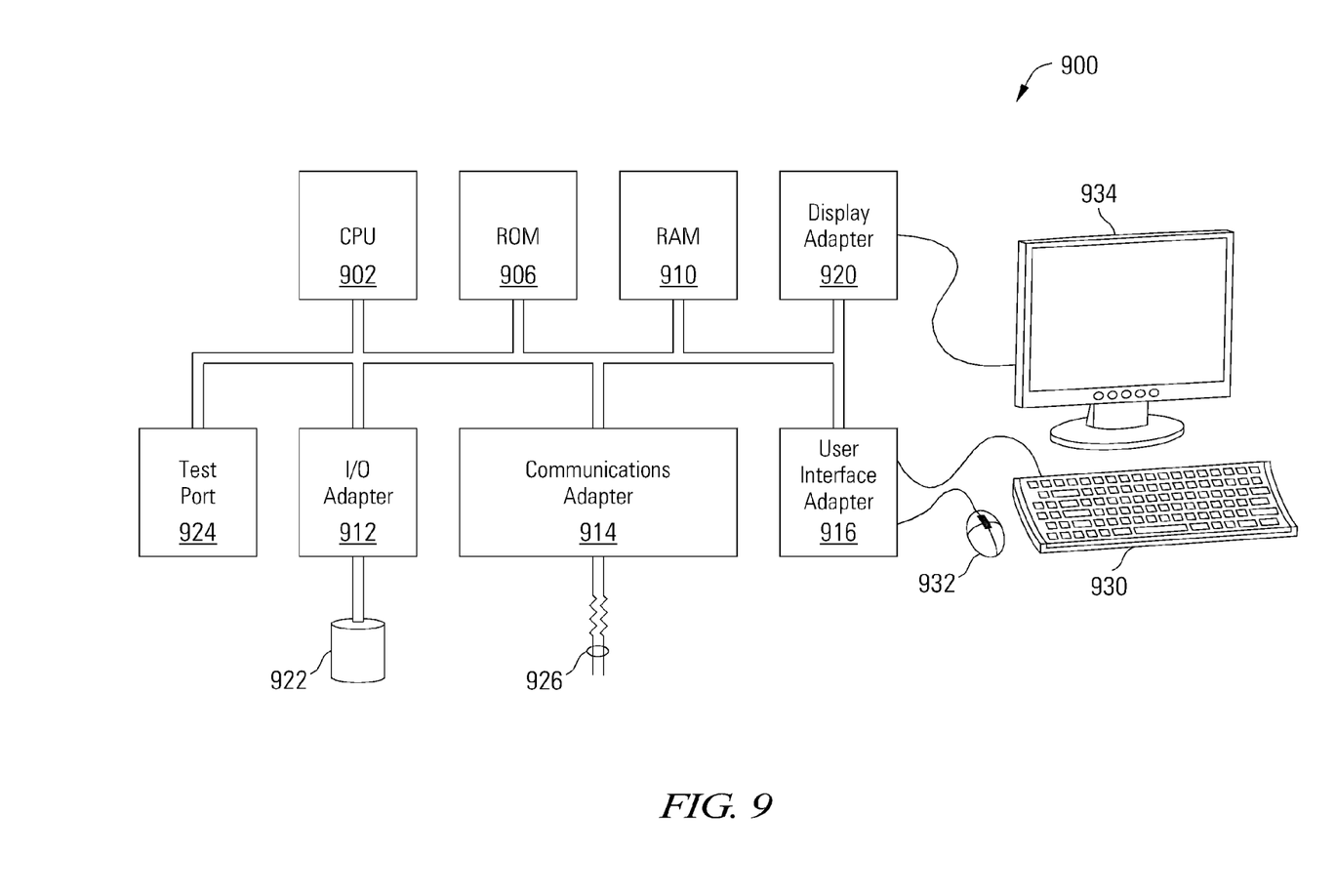
FIG. 9 depicts a computer system that may be used systems and methods for evaluating and debugging an LDPC iterative data decoder in accordance with some embodiments of the present invention.

Turning to FIG. 9, a computer system 900 is depicted that may be used in systems and methods for evaluating and debugging a data decoder such as an LDPC iterative data decoder in accordance with some embodiments of the present invention. The computer system 900 may be used, for example, to transfer data to be stored in an input memory for the data decoder, to configure and control the data decoder, and to read data from an output memory for the data decoder. The computer system 900 may also be used to generate codeword data to test the data decoder based on the system behavior model for the data decoder, and to evaluate the resulting data, for example by performing difference operations on data sets and displaying the resulting differences, or by otherwise analyzing resulting data sets to identify faults or potential improvements or optimizations in the data decoder or its surrounding components.

The computer system 900 generally includes one or more central processing units (CPU) 902 connected by a system bus 904 to devices such as a read-only memory (ROM) 906, a random access memory (RAM) 910, an input/output (I/O) adapter 912, a communications adapter 914, a user interface adapter 916, and a display adapter 920. Data storage devices such as a hard drive 922 are connected to the computer system 900 through the I/O adapter 912. A test port 924 is also provided to connect to the bus 512, 542, 642 in an evaluating/debugging interface for a data decoder. In operation, the CPU 902 in the computer system 900 executes instructions stored in binary format on the ROM 906, on the hard drive 922, and in the RAM 910, causing it to manipulate data stored in the RAM 910 to perform useful functions including the evaluation and/or debugging of data decoders as described herein. The computer system 900 may communicate with other electronic devices through local or wide area networks (e.g., 926) connected to the communications adapter 914. User input is obtained through input devices such as a keyboard 930 and a pointing device 932 which are connected to the computer system 900 through the user interface adapter 916. Output is displayed on a display device such as a monitor 934 connected to the display adapter 920.

In conclusion, the present invention provides novel systems, devices, methods and arrangements for evaluating and debugging data decoders such as LDPC decoders. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data decoder circuit, the data decoder circuit comprising:
an input memory;
an iterative data decoder operable to decode data from the input memory in one or more iterations;
an output memory operable to store decoded data from the data decoder;
a test port operable to provide access to the input memory, the data decoder and the output memory; and
a controller operable to trigger a data decoding operation in the data decoder in response to the test port and to determine how data was changed by the iterative data decoder in each of the iterations.

2. The data decoder circuit of claim 1, wherein the data decoder comprises an iterative low density parity check decoder.

3. The data decoder circuit of claim 1, wherein the data decoder circuit is implemented as an integrated circuit.

4. The data decoder circuit of claim 1, wherein the data decoder circuit is incorporated in a storage device.

5. The data decoder circuit of claim 1, wherein the data decoder circuit is incorporated in a data transmission device.

6. The data decoder circuit of claim 1, wherein the test port is connected to the input memory, the data decoder and the output memory by a register bus.

7. The data decoder circuit of claim 1, wherein the data decoder is operable to perform the iterations under the control of the test port.

8. The data decoder circuit of claim 1, wherein the input memory is operable to receive input data from a data input and from the test port, and wherein the output memory is operable to provide output data to a data output and to the test port.

9. The data decoder circuit of claim 1, wherein the controller is further operable to compare the decoded data from the output memory with expected output data after a number of the iterations expected to cause the decoded data to converge has been performed.

10. The data decoder circuit of claim 1, wherein the controller is further operable to trigger each of the iterations in the iterative data decoder.

11. A method of evaluating operation of a data decoder circuit, the method comprising:
providing codeword data to an input memory for an iterative data decoder in the data decoder circuit;
configuring the iterative data decoder to process the codeword data from the input memory in a plurality of iterations;
determining when an iteration is complete in the iterative data decoder;
reading resulting data from an output memory for the iterative data decoder; and
determining how data was changed by the iterative data decoder in each of the iterations.

12. The method of claim 11, wherein providing the codeword data comprises preparing the codeword data and writing the codeword data to the input memory via a test port.

13. The method of claim 12, wherein the codeword data is prepared based on a system behavior model for the data decoder.

14. The method of claim 11, wherein configuring the data decoder comprises configuring the data decoder to perform a plurality of decoding iterations on the codeword data.

15. The method of claim 14, wherein reading the resulting data comprises reading data from the output memory for more than one of the plurality of decoding iterations.

16. The method of claim 15, further comprising comparing the data from the output memory for each of the more than one of the plurality of decoding iterations.

17. The method of claim 11, further comprising comparing an expected result with the resulting data from the output memory.

18. The method of claim 11, further comprising comparing the codeword data with the resulting data from the output memory.

19. A system for evaluating operation of a data decoder circuit, the system comprising:
- an input memory;
- an iterative data decoder operable to decode data from the input memory in a plurality of iterations;
- an output memory operable to store decoded data from the iterative data decoder;
- a test port operable to provide access to the input memory, the iterative data decoder and the output memory; and
- a processor operable to connect to the input memory, the iterative data decoder and the output memory via a register bus, and to write test data to the input memory, to control decoding sessions in the data decoder, and to read decoded data from the output memory, and to determine how data was changed by the iterative data decoder in each of the iterations.

20. The system of claim 19, further comprising:
- a first detector operable to perform a data detection on an input data set at a first time; and
- a second detector, wherein the second detector is operable to perform a data detection on the input data set using an output of the decoder from the output memory at a second time only if the output of the decoder failed to converge, and wherein the second time is subsequent to the first time.

* * * * *